(12) United States Patent
Yi et al.

(10) Patent No.: US 6,314,050 B1
(45) Date of Patent: Nov. 6, 2001

(54) DATA STROBE BUFFER IN SDRAM

(75) Inventors: Seung-Hyun Yi; Jong-Hee Han, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/609,323

(22) Filed: Jun. 30, 2000

(30) Foreign Application Priority Data

Jun. 30, 1999 (KR) .................................................. 99-25735

(51) Int. Cl.$^7$ ...................................................... G11C 7/00
(52) U.S. Cl. ................ 365/233; 365/189.05; 365/230.08
(58) Field of Search .............................. 365/230.01, 233, 365/230.08, 189.05

(56) References Cited

U.S. PATENT DOCUMENTS

| | | | |
|---|---|---|---|
| 4,802,131 | * 1/1989 | Toyoda | .................. 365/233 |
| 4,970,687 | 11/1990 | Usami et al. | . |
| 6,002,613 | 12/1999 | Cloud et al. | . |

FOREIGN PATENT DOCUMENTS

| | | | |
|---|---|---|---|
| 09-306168 | 11/1997 | (JP) | .............................. G11C/11/409 |
| 10199239 | 7/1998 | (JP) | .............................. G11C/11/407 |
| 11288590 | 10/1999 | (JP) | .............................. G11C/11/407 |

* cited by examiner

*Primary Examiner*—Terrell W. Fears
(74) *Attorney, Agent, or Firm*—Jacobson Holman, PLLC

(57) ABSTRACT

A data strobe buffer in SDRAM is disclosed. The data strobe buffer for a synchronous dynamic read only memory (SDRAM), comprising: a first dynamic buffer generating a first pulse at a rising edge of a data strobe signal; a second dynamic buffer generating a second pulse at a falling edge of the data strobe signal; and a block for generating an enable signal which is enabled in a range between a rising edge of an external clock signal and a logic high state of the second pulse, and providing the second dynamic buffer with the enable signal. The data strobe buffer ensures a minimum value of tDQSS parameter in DDR SDRAM even if speed of the chip increases or operation condition of the chip becomes tight, thereby preventing the data strobe buffer from being misoperated due to the damping and the fluctuation of the data strobe signal.

5 Claims, 3 Drawing Sheets

DATA STROBE BUFFER IN SDRAM

FIELD OF THE INVENTION

The present invention relates to a memory device; and, more particularly, to a data strobe buffer applicable to a synchronous dynamic random access memory (SDRAM).

DESCRIPTION OF THE PRIOR ART

For achieving a high speed operation in a dynamic random access memory (DRAM), synchronous DRAMs (hereinafter, as is referred to "SDRAMs") have been developed. The SDRAM operates in synchronization with an external clock signal. The SDRAM includes a single data rate (SDR) SDRAM, a double data rate (DDR) SDRAM and the like.

The SDR SDRAM operates in synchronization with rising edges of the external clock, so that one data is processed within one period of the external clock. On the contrary, the DDR SDRAM operates in synchronization with rising and falling edges of a data strobe signal, so that two successive data are processed within one period of the external clock. Therefore, compared with the SDR SDRAM, the DDR SDRAM achieves at least twice the operation speed without increasing frequency of the external clock. At this time, the data strobe signal is a signal instructing reception of a data to a controller.

In DDR SDRAM, the data strobe (hereinafter, as is referred to "DS") signal maintains a high impedance state on idle state. In other words, the DS signal maintains the high impedance until the external clock is enabled. There is damping or fluctuation of the DS signal when the DS signal goes back to the high impedance state after being applied to a chip.

A data strobe buffer, which receives the DS signal as an input signal and outputs a pulse, generally includes two dynamic buffers. One generates a pulse on a rising edge of the DS signal ds. The other generates a pulse on a falling edge of the DS signal ds.

In the conventional data strobe buffer as mentioned above, both of two dynamic buffers always operate on a write operation. Accordingly, even if a small fluctuation of the DS signal occurs, an undesirable output is generated. Since an initial state of the DS signal is a high impedance state, if there is fluctuation, the data strobe buffer operates. The undesirable output of the data strobe buffer makes the chip rate higher. Also, the undesirable output of the data strobe buffer causes misoperation of the chip when an operational condition is tight.

A pulse generated at the rising edge does not influence on the operation of the chip. A pulse generated at a falling edge causes misoperation of the chip.

Not only DDR SDRAM but also all of SDRAMs using the data strobe signal have these disadvantages.

SUMMARY OF THE INVENTION

Therefore, it is an object to provide a data strobe buffer in SDRAM, the data strobe buffer preventing a chip from misoperating due to damping or fluctuation of a data strobe signal.

In accordance with an aspect of the present invention, there is provided to a data strobe buffer for a synchronous dynamic read only memory (SDRAM), including: a first dynamic buffer generating a first pulse at a rising edge of a data strobe signal; a second dynamic buffer generating a second pulse at a falling edge of the data strobe signal; and a block for generating an enable signal which is enabled in a range between a rising edge of an external clock signal and a logic high state of the second pulse, and providing the second dynamic buffer with the enable signal.

BRIEF DESCRIPTION THE DRAWINGS

The above and other objects and features of the instant invention will become apparent from the following description of preferred embodiments taken in conjunction with the accompanying drawings, in which.

PREFERRED EMBODIMENTS OF THE INVENTION

Hereinafter, preferred embodiments of the present invention will be described in detail with reference to the accompanying drawings.

Figure 1:
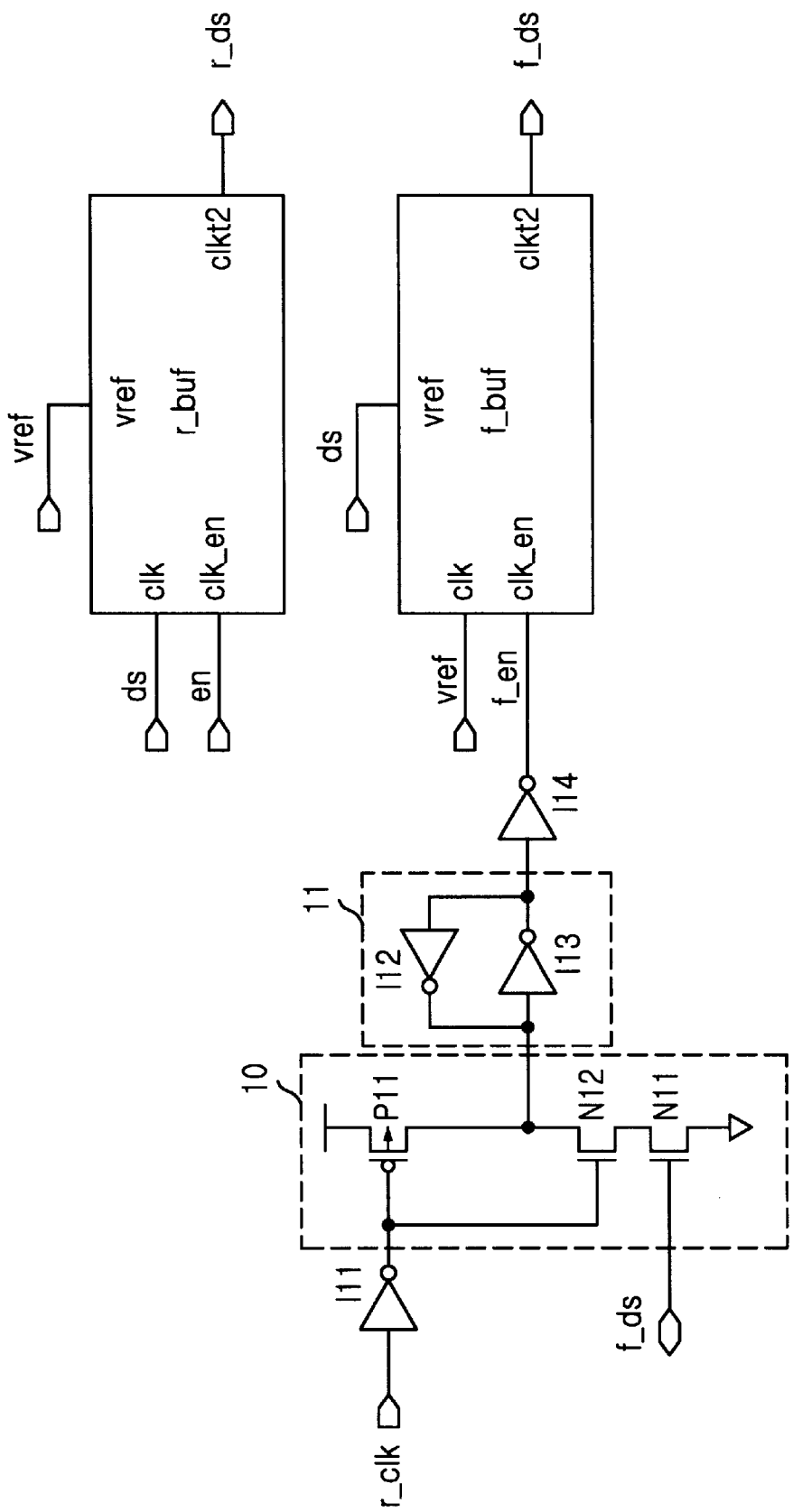
FIG. 1 is a circuit diagram of a data strobe buffer in accordance with one embodiment of the present invention.

FIG. 1 is a circuit diagram of a data strobe buffer in accordance with one embodiment of the present invention.

A data strobe buffer (hereinafter, as is referred to "DS buffer") includes two dynamic buffers. A first dynamic buffer r_buf generates a pulse on a rising edge of a data strobe signal ds. A second dynamic buffer f_buf generates a pulse on a falling edge of the data strobe signal ds.

The first dynamic buffer r_buf receives a reference voltage vref having the same level as a high impedance state through a first input end vref, a data strobe signal ds (hereinafter, as is referred to "DS signal") through a second input end clk and a first buffer enable signal en through a third input end clk_en. The first dynamic buffer r_buf generates a first pulse r_ds which goes to a logic high state at the rising edge of the DS signal ds, and outputs the first pulse r_ds to a first output end clkt1.

The second dynamic buffer f_buf receives a DS signal ds through a first input end vref, a reference voltage vref through a second input end clk and a second buffer enable signal f_en through a third input end clk_en. The second dynamic buffer f_buf generates a second pulse f_ds which goes to the logic high state at the falling edge of the DS signal ds, and outputs the second pulse f_ds to a second output end clkt2.

A circuit for generating the second buffer enable signal f_en includes inverters I11, 10 and I14 and a latch.

The inverter I11 inverts a pulse r_clk which goes to the logic high state at every rising edge of an external clock signal CLK. The pulse r_clk is a train pulse which means a series of pulses.

The inverter 10 receives an output signal of the inverter I11 and the second pulse f_ds generated at the falling edge of the DS signal ds. The inverter 10 inverts the output signal of the inverter I11 according to the second pulse f_ds.

The inverter 10 includes a pull-up PMOS P11 and a pull-down NMOS N12 each of which input is the output signal of the inverter I11, and a pull-down NMOS N11 of which input is the second pulse f_ds.

When the pull-down NMOS N11 turns on, the inverter 10 inverts the output signal of the inverter I11. When the pull-down NMOS N11 turns off, the inverter 10 outputs a high impedance signal.

The latch 11 receives and stores an output signal of the inverter 10 until another signal is inputted to the latch 11. The latch 11 includes two inverters I12 and I13 each of which input is coupled to an output of the other inverter in parallel.

The inverter I14 inverts an output signal of the latch 11.

The dynamic buffer r_buf is the same as the conventional dynamic buffer outputting the first pulse r_ds. The first dynamic buffer r_buf receives the first buffer enable signal en which is a level signal.

On the contrary, the second dynamic buffer f_buf receives the second buffer enable signal f_en which is a pulse signal.

Figure 2:
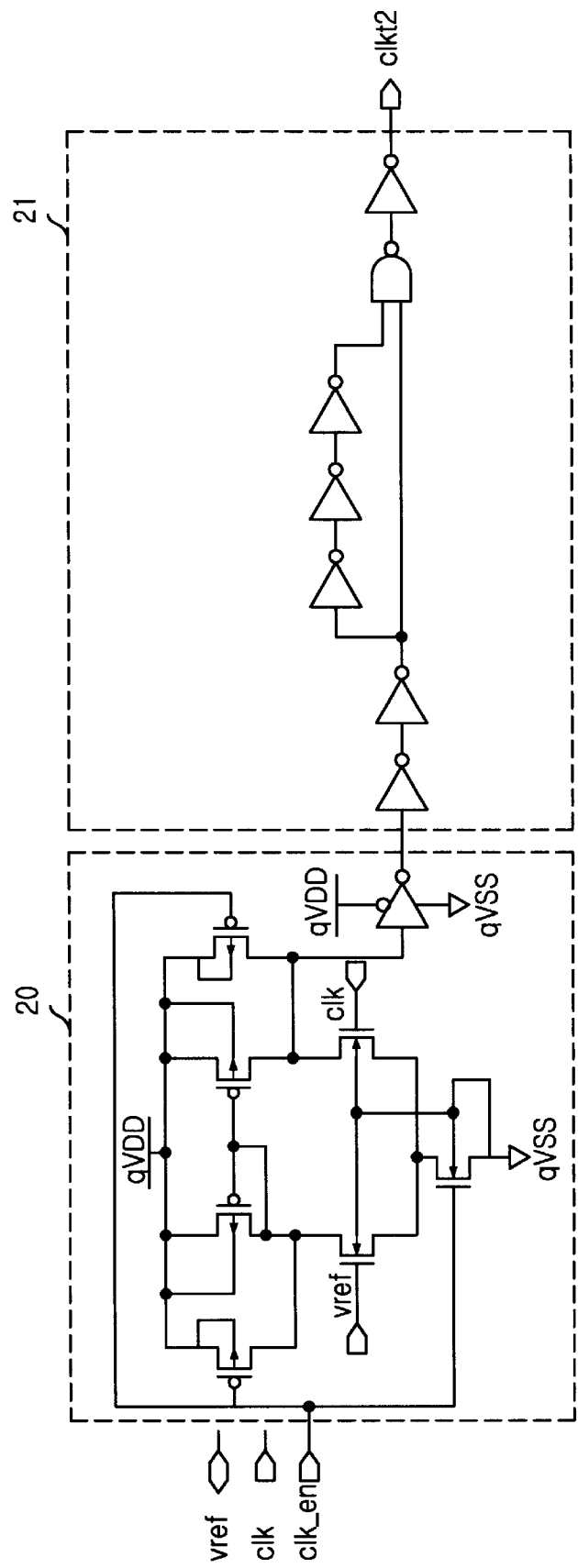
FIG. 2 is a general dynamic buffer applied to one embodiment of the present invention.

FIG. 2 is a general dynamic buffer applied to one embodiment of the present invention.

The dynamic buffer includes a current mirror type differential amplifying block 20 and a pulse generating block 21.

The current mirror type differential amplifying block 20 compares the reference voltage with a signal inputted through an end clk. At this time, the current mirror type differential amplifying block 20 uses a quiet VDD qVDD as a power supply and a quiet VSS qVSS as a ground.

In this drawing, the current mirror type differential amplifying block 20 compares the reference voltage with a signal inputted through the end clk. If the reference voltage is higher than the voltage at the end clk, the current mirror type differential amplifying block 20 outputs a high level signal. On the contrary, if the reference voltage is lower than the voltage at the end clk, the current mirror type differential amplifying block 20 outputs a low level signal.

The pulse generating block 21 receives the output of the current mirror type differential amplifying block 20 and generates a high active pulse.

The dynamic buffer illustrated in FIG. 2 is well known to one skilled in the art, therefore, detailed description about the dynamic buffer will be skipped in this specification.

Hereinafter, the data strobe buffer in accordance with the present invention will be described in detail with reference to FIGS. 1 and 3.

Figure 3:
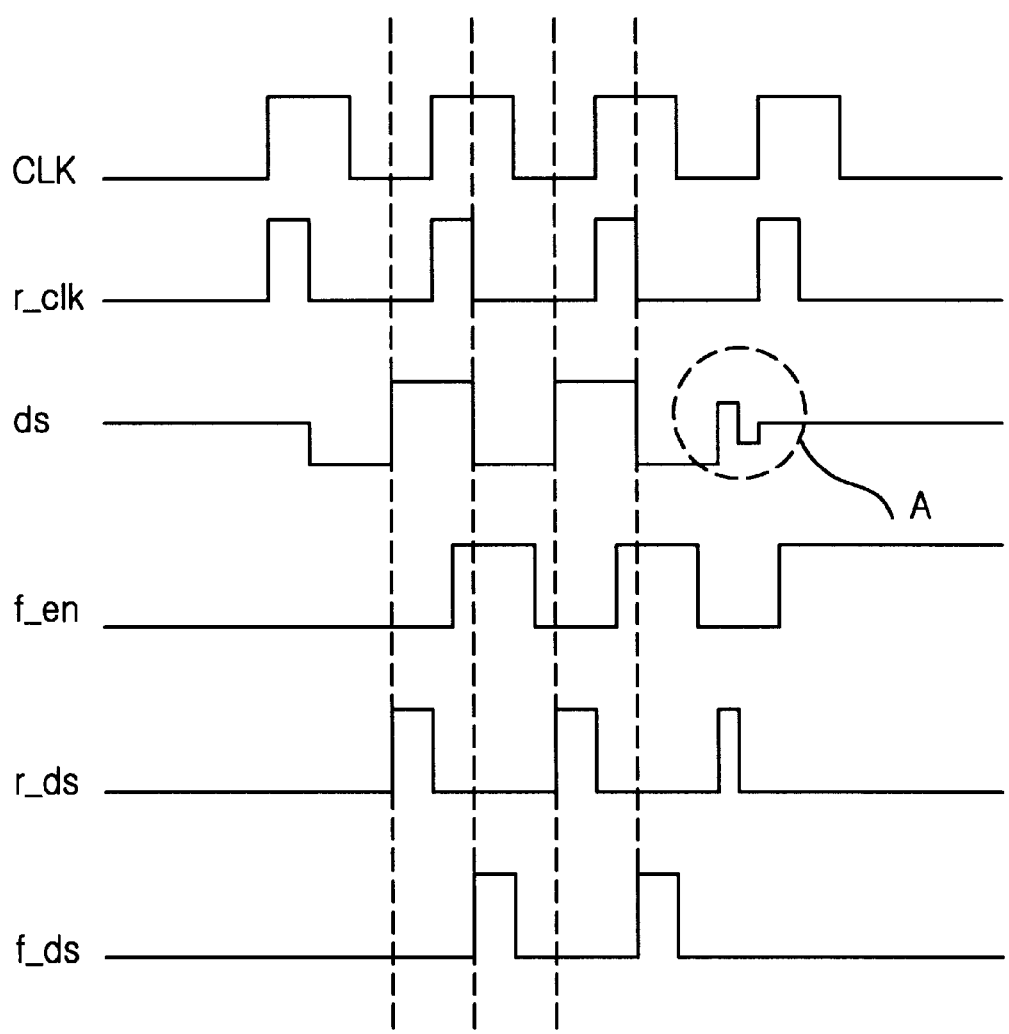
FIG. 3 is a timing diagram of the data strobe buffer in FIG. 1.

FIG. 3 is a timing diagram of the data strobe buffer in FIG. 1.

In this drawing, it is assumed that a first rising edge of the data strobe signal occurs in a minimum value of tDQSS parameter, i.e., 0.75 tCK from the external clock signal.

In the dynamic buffer r_buf, the DS signal ds and the reference voltage vref are respectively inputted to the first and second ends clk and vref. In the second dynamic buffer f_buf, the DS signal ds is inputted to inputted to the first end vref and the reference voltage vref inputted to the second ends clk in opposition to the first dynamic buffer r_buf.

The first dynamic buffer r_buf generates a first second pulse r_ds at the rising edge of the DS signal. The second dynamic buffer f_buf generates the second pulse f_ds at the falling edge of the DS signal ds.

The first dynamic buffer r_buf generating the first pulse r_ds is controlled by the first buffer enable signal en. The first buffer enable signal en is a high level signal in a range where the data strobe signal ds is inputted, and enables the first dynamic buffer r_buf.

However, the second dynamic buffer f_buf is controlled by the second buffer enable signal f_en. The second buffer enable signal f_en is enabled from the logic low state to the logic high state when the pulse r_clk goes to the logic high state. The second buffer enable signal f_en is disabled from the logic high state to the logic low state when the second output pulse f_ds of the second dynamic buffer f_buf is enabled. The second output pulse f_ds is enabled at the falling edge of the DS signal ds.

In other words, if the pulse r_clk goes to the logic high state, the inverter 10 outputs a high level signal, the latch 11 stores the low level until another input is inputted. At this time, the second buffer enable signal f_en maintains the logic high state and then enables the second dynamic buffer f_buf. The second dynamic buffer f_buf generates and outputs the second pulse f_ds having the logic high state at the falling edge of the DS signal ds. When the second pulse f_ds is applied to the inverter 10, the output of the inverter 10 goes from the logic high state to the logic low state and the latched value is changed to the logic low state. Then the second buffer enable signal f_en goes from the logic high state to the logic low state. Finally, the second dynamic buff f_buf is disabled.

Referring to FIG. 3, the second buffer enable signal f_en is enabled as the logic high state in a range from the rising edge of the external signal CLK to the falling edge of the DS signal ds. When the DS signal ds is returned from the logic high state to the high impedance state, the damping A occurs. The second buffer enable signal f_en is disabled for the falling edge of the damping A in the DS signal ds. Accordingly, the buffer enable signal f_en prevents the second pulse signal f_ds from being enabled to the logic high state. In other words, the damping A of the DS signal ds prevents normal operation of the chip in a range between the last pulse of the second pulse signal f_ds and the rising edge of the external signal CLK. According to the data strobe buffer in accordance with the present invention, since the second buffer enable signal f_en is disabled during the range between the last pulse of the second pulse signal f_ds and the rising edge of the external signal CLK, the undesired pulse in the second pulse f_ds does not occur.

The second pulse f_ds occurs only when the second buffer enable signal f_en is the logic high state. Since the second buffer enable signal f_en is always the logic low state at the falling edge of the DS signal ds due to the damping A, the undesired pulse in the second pulse signal f_ds does not occur.

The first pulse r_ds occurs at the rising edge of the DS signal due to the damping A. However, the pulse r_ds does not affect on the operation of the chip as mentioned above.

The data strobe buffer in accordance with the present invention ensures a minimum value of tDQSS parameter in DDR SDRAM even if speed of the chip increases or operation condition of the chip becomes tight, thereby preventing the data strobe buffer from being misoperated due to the damping and the fluctuation of the data strobe signal.

Although the preferred embodiments of the invention have been disclosed for illustrative purpose, those skilled in the art will be appreciate that various modifications, additions and substitutions are possible, without departing from the scope and spirit of the invention as disclosed in the accompanying claims.

What is claimed is:

1. A data strobe buffer for a synchronous dynamic random access memory (SDRAM), comprising:
   a first dynamic buffer generating a first pulse at a rising edge of a data strobe signal; and
   a second dynamic buffer generating a second pulse at a falling edge of the data strobe signal; and
   means for generating an enable signal which is enabled in a range between a rising edge of an external clock signal and a logic high state of the second pulse, and for providing the second dynamic buffer with the enable signal.

2. The data strobe buffer as recited in claim 1, wherein the means for generating an enable signal includes:

an inverter for inverting a pulse which goes from a logic low state to a logic high state on a rising edge of the external signal; and a latch for latching an output signal of the inverter.

3. The data strobe buffer as recited in claim 2, wherein the inverter includes:

a pull-up PMOS of which gate receives an inverted signal of the pulse;

a first pull-down NMOS of which gate receives the inverted signal of the pulse; and a second pull-down NMOS of which gate receives the second pulse.

4. The data strobe buffer as recited in claim 1, wherein the second dynamic buffer includes:

a current mirror type differential amplifier of which inputs are a data strobe signal and a reference voltage, the current mirror type differential amplifier being controlled by the enable signal; and a pulse generating means for receiving an output of the current mirror type differential amplifier and generating a pulse.

5. The data strobe buffer as recited in claim 4, wherein the current mirror type differential amplifier uses a quiet VDD as a power supply and quiet VSS as a ground.

* * * * *